Nov. 13, 1962 H. B. S. BRABHAM 3,064,199

TUNABLE DISCRIMINATOR APPARATUS

Filed Oct. 14, 1958 2 Sheets-Sheet 1

TUNABLE DISCRIMINATOR APPARATUS

Filed Oct. 14, 1958 2 Sheets-Sheet 2

3,064,199

TUNABLE DISCRIMINATOR APPARATUS

Hugh B. S. Brabham, Northwood Hills, England, assignor to Hazeltine Research, Inc., Chicago, Ill., a corporation of Illinois Filed Oct. 14, 1958, Ser. No. 767,128
Claims priority, application Great Britain Oct. 21, 1957
7 Claims. (Cl. 329—137)

Figure 1:
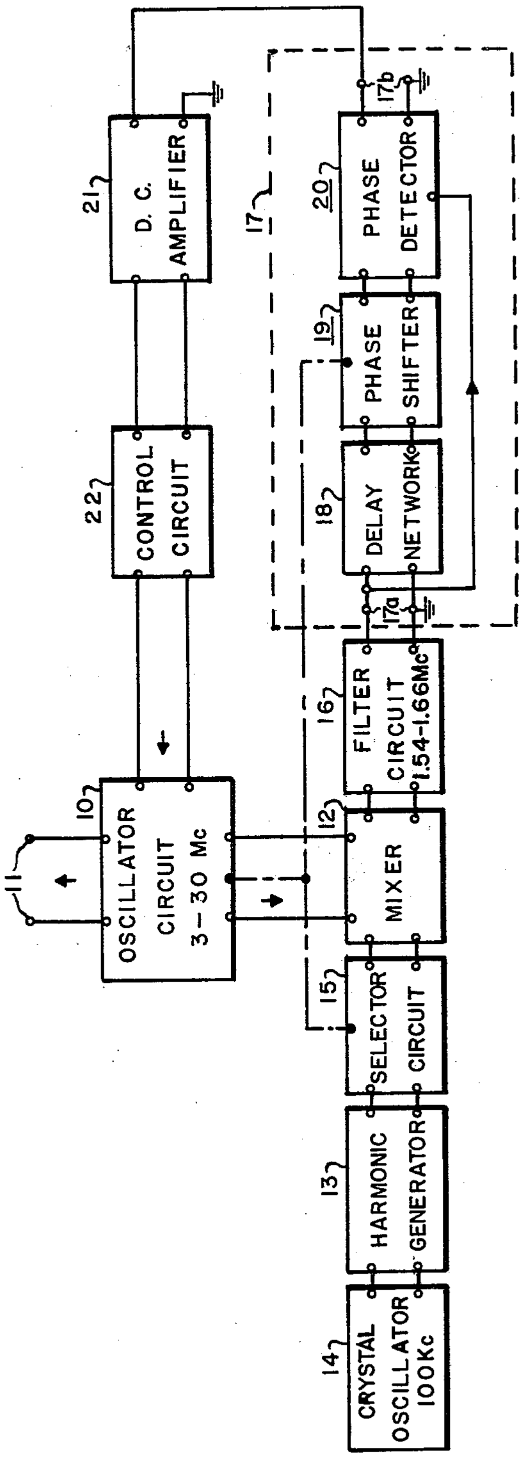

This invention relates to tunable discriminator apparatus and to systems utilizing such discriminator apparatus. By tunable discriminator apparatus is meant apparatus which is adapted to give an output voltage whose magnitude is dependent upon the frequency of an input signal applied to the circuit and which may be adjusted to give an output voltage of predetermined magnitude for an input signal of any desired frequency within a predetermined range of frequencies.

In one known form of a tunable electric oscillator having automatic frequency control, the oscillator includes an oscillator circuit a portion of the output of which is arranged to be heterodyned in a mixer circuit with the output of a harmonic generator which is controlled by a fundamental oscillator of accurately constant frequency. The heterodyne output of the mixer circuit is fed to a filter circuit which is arranged to pass one of the signals constituting the output of the mixer circuit, and the output of the filter circuit is fed to a discriminator circuit, which is tunable over a frequency range having a width approximately equal to the frequency of the fundamental oscillator, an automatic frequency control signal being arranged to be obtained from the discriminator circuit and fed to the oscillator circuit via a reactor which controls the frequency of the oscillator circuit. It will be appreciated that, in this arrangement, the tuning range should be restricted so that it is slightly less than the frequency of the fundamental oscillator for otherwise a complication would arise in that occasionally two signals would be passed by the filter having frequencies differing by an amount equal to the frequency of the fundamental oscillator, one of the signals having a frequency adjacent the lower limit of the pass band of the filter and the other signal having a frequency adjacent the upper limit of the pass band of the filter. However, if in the arrangement described above a discriminator circuit in accordance with the present invention is used, the tuning range of the discriminator circuit can be made slightly greater than the frequency of the fundamental oscillator without any deleterious effects occurring, for if the discriminator circuit is arranged so that the value of said first amount of difference in phase in respect of one of a pair of signals fed to the input of the circuit differs by 360° from the value of said first amount of difference in phase in respect of the other of the pair of signals, the signals will be treated as a single signal by the discriminator circuit. Also, the means for varying said second amount of difference in phase in a discriminator circuit in accordance with the invention can be arranged so that said second amount of difference in phase can be continuously varied in the same sense, said second amount successively varying from zero to 360° and returning instantaneously to zero, and said means can be ganged with the tuning control means of the tunable oscillator. Thus it will be appreciated that by using a discriminator circuit in accordance with the invention, it is possible to obtain a tunable oscillator which is continuously tunable over a wide range and whose output frequency is accurately known.

It is therefore an object of the present invention to provide new and improved tunable discriminator apparatus which overcomes the difficulties and limitations of prior known discriminators.

It is another object of the invention to provide tunable discriminator apparatus with an increased tuning range.

It is a further object of the invention to provide a tunable oscillator having automatic frequency control for developing an output signal of accurately known frequency continuously tunable over a wide range.

In accordance with the present invention continuously tunable discriminator apparatus comprises means for supplying a wave signal normally having a frequency component which may be varied within a fixed range, but subject to having a plurality of frequency components within the range respectively spaced apart by a predetermined frequency. The apparatus also includes means, including a plurality of signal-translating channels, coupled to the supply means for deriving from the supplied wave signal a corresponding plurality of signals having the same frequency, one of the aforementioned channels including means for varying the phase of one of the derived signals by a first amount dependent upon the wave signal frequency up to a maximum limit equivalent to the period of one cycle of the difference frequency, the one channel also including continuously rotatable means for varying the phase of the above-mentioned one signal by a second amount which is substantially independent of the supply signal frequency. The apparatus further includes means responsive to the plurality of signals for deriving an output voltage having a magnitude dependent upon the overall phase difference between the plurality of signals.

For a better understanding of the present invention, together with other and further objects thereof, reference is had to the following description taken in connection with the accompanying drawings, and its scope will be pointed out in the appended claims.

Figure 2:
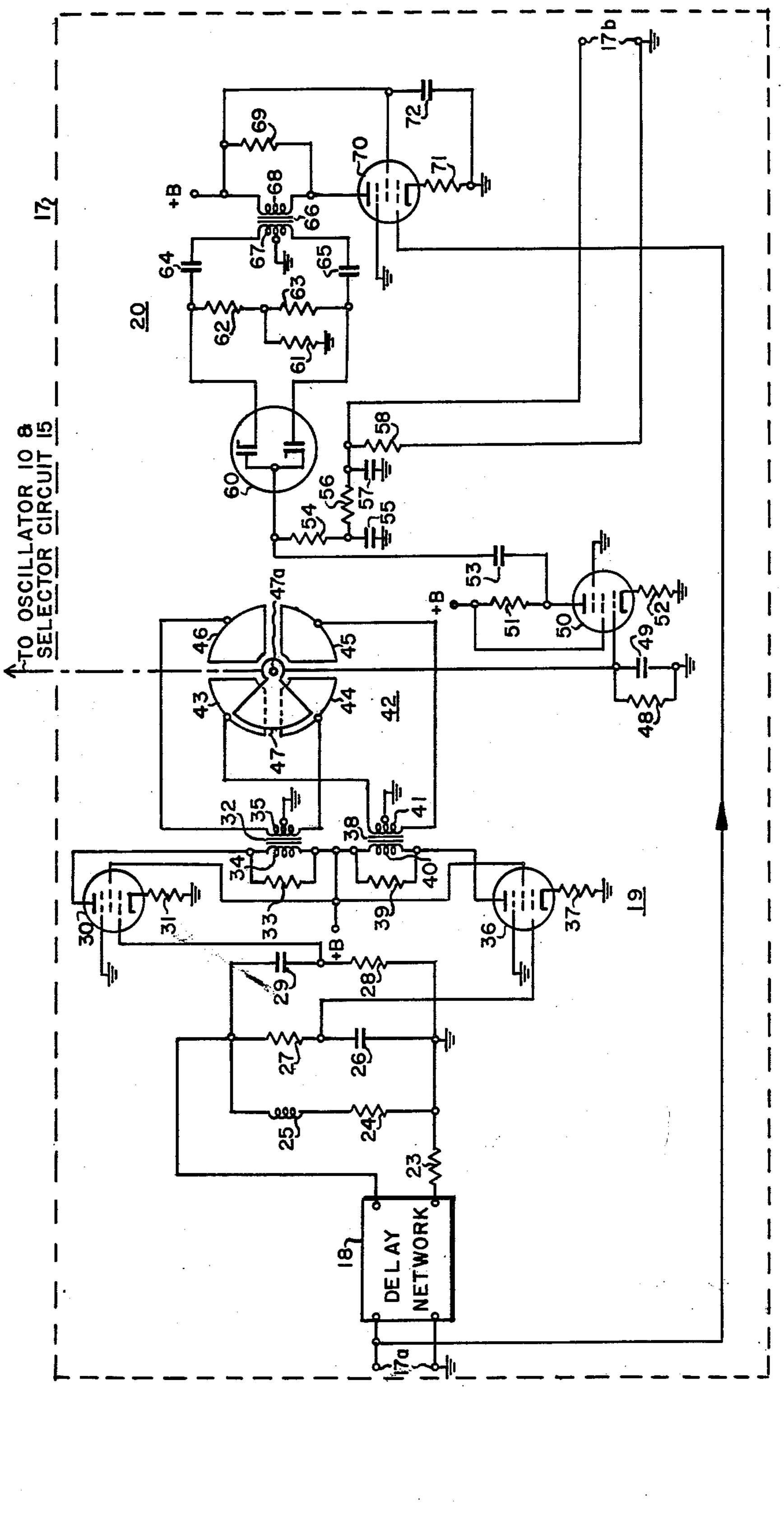

Referring to the drawings:

FIGURE 1 is a circuit block diagram of a tunable electric oscillator designed to be continuously tunable over a range from 3 mc./s. to 30 mc./s. and having automatic frequency control; and FIGURE 2 is a circuit diagram of a variable discriminator circuit utilized in the oscillator illustrated in FIGURE 1.

*Description of Tunable Oscillator of FIG. 1*

Referring to FIGURE 1 of the drawings, the tunable electric oscillator may include a tunable Hartley oscillator circuit 10 having output terminals 11, 11 and having a portion of the output arranged to be fed to a mixer circuit 12 where it is heterodyned with part of the output of a harmonic generator 13 which is controlled by a crystal oscillator circuit 14 designed to generate a frequency of 100 kc./s., the output of harmonic generator 13 consisting of a spectrum of frequencies spaced 100 kc./s. apart. It will be appreciated that if the whole of the output of harmonic generator 13 were fed to mixer circuit 12, the difference frequencies in the output of mixer circuit 12 would consist of two spectra of frequencies spaced 100 kc./s. apart,, since the output of oscillator circuit 10 would beat with harmonics from harmonic generator 13 having frequencies both greater and less than the frequency of said output. In the present case, however, it is arranged that the difference frequencies in the output of mixer circuit 12 are constituted by only one set of frequencies spaced 100 kc./s. apart and lying within a limited frequency range. In order to achieve this, a harmonic selector circuit 15 is included in the path between harmonic generator 13 and mixer circuit 12. Selector circuit 15 may take the form of a tuned circuit having a tuning control ganged with the tuning control of oscillator circuit 10 so that only harmonics having frequencies which are less than the frequency of the output of oscillator circuit 10 by 1.6 mc./s.±a few hundred kilocycles are passed to mixer circuit 12. The output of mixer circuit 12 consists therefore of a set of frequencies spaced 100 kc./s. apart whose values are dependent upon the frequency of the output of oscillator circuit 10, and the output of mixer circuit 12 is fed to an intermediate frequency filter circuit 16 designed to have a pass band ranging from about 1.54 mc./s. to about 1.66 mc./s.

The output of filter circuit 16 is applied to tunable discriminator apparatus 17 constructed in accordance with the present invention and which is tunable over a range from 1.55 mc./s. to 1.65 mc./s. The tuning control of discriminator apparatus 17 is ganged with that of oscillator circuit 10 so that oscillator circuit 10 may be continuously tuned by operation of the tuning control of discriminator apparatus 17. The discriminator is tuned by means of a rotatable shaft (not shown in FIGURE 1) on which is mounted a condenser plate forming part of a condenser arrangement (this arrangement is described in detail later); one rotation of this shaft corresponds to a change in the frequency of the output of the oscillator circuit 10 of 100 kc./s. Discriminator apparatus 17 may have a tuning dial (not shown) which is linearly calibrated to read from 0–100 kc./s. while oscillator circuit 10 would then have a tuning dial (not shown) which is linearly calibrated in intervals of 100 kc./s. Thus if oscillator circuit 10 were tuned to 12.3456 mc./s., the dial of oscillator circuit 10 would read between 12.3 mc./s. and 12.4 mc./s. while the dial of discriminator apparatus 17 would read 45.6 kc./s.

Discriminator apparatus 17 is so designed that, when the frequency of the output of oscillator circuit 10 corresponds to the frequency indicated by the dials of oscillator circuit 10 and discriminator apparatus 17, the output of discriminator apparatus 17 is substantially zero, and that, when there is a discrepancy between the frequency of oscillator circuit 10 and the frequency indicated by the dials, discriminator apparatus 17 produces at output terminals *17b*, *17b* an automatic frequency control signal. This automatic frequency control signal is arranged to be applied via a direct current amplifier 21 to a control circuit 22, which may include a conventional reactance tube, connected to oscillator circuit 10, the arrangement being such that the frequency of the output of oscillator circuit 10 is thereby corrected to correspond to the frequency indicated by the dials. It will be appreciated however that, although normally only one signal is passed by the intermediate frequency filter 16 to discriminator apparatus 17, occasionally two signals having frequencies spaced apart by 100 kc./s. will be applied to discriminator apparatus 17, one of the signals having a frequency adjacent the lower limit of the pass band of filter 16 and the other signal having a frequency adjacent the upper limit of the pass band. In order to overcome this difficulty, discriminator apparatus 17 is so designed that its output voltage is substantially the same when two such signals are applied to apparatus 17 as that which would be produced if only one of the signals were applied thereto, so that in effect apparatus 17 treats two such signals as a single signal having a frequency equal to that of either of the two signals.

*General Description of Discriminator Apparatus of FIG. 1*

Tunable discriminator apparatus 17 will now be generally described. Fundamentally, discriminator apparatus 17 includes two paths into which the signal or signals applied to the circuit are split, one of the paths including a delay network 18 designed to alter the phase of an input signal applied to the circuit by a first amount which is dependent upon the frequency of the input signal and a second device 19 designed to alter the phase of the output signal from net work 18 by a second amount which is variable but is substantially independent of the frequency of the input signal. Discriminator apparatus 17 also includes a device 20 for comparing the signals passed by said two paths so as to produce an output voltage whose magnitude is dependent upon the phase difference between the signals passed by said paths. Network 18 may comprise a conventional delay line, a variable phase shifting device, designed to act as the tuning device of the discriminator, forms the second device 19, and the comparison device 20 is in the form of a phase detector which is designed to give a substantially zero output when the signals applied to it are in phase quadrature.

In the present arrangement, the delay line of network 18 has a resistance of 1500 ohms and is designed to delay signals passing along it by about 10 microseconds, so that the delay cable produces a phase shift of 3.6° per kc. It will be appreciated that this time is equal to the period of one cycle of crystal oscillator circuit 14, so that the output produced by discriminator apparatus 17 when two signals spaced 100 kc./s. apart are applied to it is identical with the output of apparatus 17 which would be produced if either of the signals were applied singly thereto. For simplicity, it will be assumed in the following description that only one signal is present at input terminals *17a*, *17a* of discriminator apparatus 17.

*Description of Tunable Discriminator Apparatus of FIG. 2*

The actual circuit arrangement of tunable discriminator apparatus 17 will now be described with particular reference to FIGURE 2 of the drawings. The output from intermediate frequency filter 16 is applied between input terminals *17a*, *17a* provided at the input of apparatus 17 and coupled to one end of delay network 18. Variable phase shifting device 19 of discriminator apparatus 17 includes a circuit network coupled to the output of network 18 and being designed to have an input impedance which is substantially independent of frequency at least over the range of frequencies applied to discriminator apparatus 17 and to provide two output signals which are substantially in phase quadrature, whatever the frequency of an input signal applied to the network. The circuit network includes three circuit combinations which are all connected together in parallel, one of the circuit combinations consisting of an inductor 25 having a value of L henries and a resistor 24 having a value of R ohms which are connected together in series, the second circuit combination consisting of a resistor 27 having a value of 2R ohms and a capacitor 26 having a value of ½C farad which are connected together in series, and a third circuit combination also consisting of a resistor 28 having a value of 2R ohms connected in series with a capacitor 29 having a value of ½C farad. The connection between the inductor 25 and resistor 27 and the capacitor 29 is connected to one of the output terminals of delay network 18 and the connection between the resistor 24, the capacitor 26 and the resistor 28 is connected through a resistor 23 to the other output terminal of delay network 18. Two signals are arranged to be respectively obtained from across capacitor 26 and from across the resistor 28 and it can be shown that the two signals are in phase quadrature, whatever their frequency. It can also be shown that, if the values of the components 25, 24, 27, 26, 28, and 29 in the above network are so chosen that $L=CR^2$, the resistance of the network is independent of frequency and therefore constant, and that, if the frequency of a signal applied to the network equals $$\frac{1}{2\pi CR}$$

the amplitudes of the two signals are equal. In the present case, $L=149$ microhenries, $R=1{,}500$ ohms and $C=66$ micromicrofarads so that the impedance of the network is substantially constant and the two signals obtained from the network have substantially equal amplitudes as well as being in phase quadrature.

The two signals obtained from the above network are respectively amplified in two similar amplifying stages which respectively include pentode valves 30 and 36. Two resistors 31 and 37 are respectively included in the cathode circuits of the valves 30 and 36 and the primary windings 34 and 40 of two transformers 32 and 38 are respectively included in the anode circuits of the valves 30 and 36. The windings 34 and 40 are respectively connected in parallel with two resistors 33 and 39. The transformers 32 and 38 respectively include two center-tapped secondary windings 5 and 41, the outputs from which are applied, in a manner to be described in detail below, to a condenser arrangement generally designated 42 which also forms part of variable phase shifting device 19.

Condenser arrangement 42 consists of four similar stator plate assemblies 43, 44, 45, and 46, each assembly 43, 44, 45, or 46 comprising seven equal quadrantal plates disposed parallel to and in register with one another and spaced apart by equal distances, and a rotor plate assembly 47 comprising eight equal quadrantal plates having the same size and being arranged in a similar manner to the plates in each stator plate assembly 43, 44, 45, or 46. Rotor plate assembly 47 is arranged so that its plates are parallel with the plates of stator plate assemblies 43–46 and are interleaved with the latter plates, each plate of rotor plate assembly 47 being disposed adjacent a set of four corresponding plates from the four stator plate assemblies 43–46. The plates of assembly 47 are mounted on a rotatable shaft *47a* which passes through these plates adjacent the orthogonal apices of the plates, rotor plate assembly 47 being rotatable about an axis which is perpendicular to the plates of the assemblies 43–46. Shaft *47a* forms the tuning control shaft, referred to above, of discriminator apparatus 17.

The signals obtained from the end terminals of secondary winding 35 are respectively applied to the stator plate assemblies 43 and 45 and the signals obtained from the end terminals of the secondary winding 41 are respectively applied to the stator plate assemblies 44 and 46. It will be appreciated that the signals applied to the stator plate assemblies 43–46, are all of substantially equal amplitude and have different phases sequentially spaced 90° apart. An output signal is arranged to be obtained from rotor plate assembly 47, the arrangement being such that the output signal is substantially constant in amplitude irrespective of the frequency of the signal applied to discriminator apparatus 17 and that the phase of the output signal corresponds approximately to the angular position of rotor plate assembly 47 with respect to the stator plate assemblies 43–46, the discrepancy between said phase and said angular position being at the most about +4°. Phase shifting device 19 is so designed that, when the dial of discriminator apparatus 17 is set to zero, the phase of the output signal from rotor plate assembly 47 is 90° in advance of that of the output signal from delay network 18, and that, as the tuning device of discriminator apparatus 17 is adjusted so that the reading of the dial gradually increases, the phase of the output signal from rotor plate assembly 47 is gradually advanced with respect to that of the output signal from delay network 18.

The output signal from rotor plate assembly 47 is applied to the control grid of a pentode valve 50 which forms part of a further amplifying stage. The control grid of valve 50 is connected to ground through the parallel combination of grid leak resistor 48 and capacitor 49. The optimum value of the capacitor 49 is dependent on the value of the capacity of each quadrant of the condenser arrangement 42 when rotor plate assembly 47 is aligned with one of the stator plate assemblies 43–46, the optimum value being equal to $$\frac{1}{\sqrt{2}}$$

of this value of the capacity of each quadrant. Resistor 52 is included in the cathode circuit of pentode 50 and load resistor 51 is included in the anode circuit of pentode 50. The output of the last-mentioned amplifying stage is fed through capacitor 53 to phase detector circuit 20 which may employ a double diode valve 60. It is found that that part of the circuit described above between delay network 18 and valve 60 introduces a slight change in the phase of a signal passing through said part of the circuit with respect to the phase of another signal of different frequency also passing through said part of the circuit, this change being about 2° for two signals differing in frequency by 100 kc./s.; this phase change may be compensated for my arranging that delay network 18 causes a difference of 358° (instead of 360°) in the phase shift of two signals having frequencies spaced 100 kc./s. apart which are passed through the delay network 18.

One of the anodes of the double diode 60 is directly connected to the cathode of the other half of the double diode 60, and the signal obtained from valve 50 of the last amplifying stage is applied to this connection. The other electrodes of the double diode 60 are connected together through two resistors 62 and 63 of equal values which are connected in series and are respectively connected through two capacitors 64 and 65 to the end terminals of a center-tapped winding 67 of transformer 66. The connection between resistors 62 and 63 is connected through resistor 61 to ground and the center tapping of winding 67 is connected directly to ground.

The second path of discriminator apparatus 17 is formed by connecting one of input terminals *17a*, *17a* to the control grid of pentode valve 70 forming part of a further amplifying stage, the secondary winding 68 of transformer 66, which is connected in parallel with resistor 69, being included in the anode circuit of the pentode 70. A resistor 71 is included in the cathode circuit of the pentode 70 and a decoupling capacitor 72 is connected between the screen grid of the pentode 70 and ground.

The phase detector 20 operates in a manner well known in the art to produce an output voltage having a magnitude which is dependent on the difference in phase ($\phi$) between the two signals applied to phase detector 20. It can be shown that the magnitude of the potential difference between the connection between the resistors 62 and 63 and those electrodes of the double diode 60 which are connected directly together is substantially equal to $V_1 \cos \phi$ where $V_1$ is the maximum voltage appearing across the whole of the winding 67. In order to keep any errors produced by phase detector 20 small, the maximum amplitude ($V_2$) of the other signal applied to phase detector 20 (that is to say the signal applied to those electrodes of the double diode 60 which are connected directly together) should be large compared with $V_1$; in the present case $V_2$ is arranged to be at least twice as large as $V_1$.

Those electrodes of double diode 60 which are connected directly together are connected through a resistor 54 to a filter circuit of high impedance constituted by a resistor 56, two capacitors 55 and 57 and a resistor 58 of high value. The output of phase detector 20 is taken from across the output of the last-mentioned filter circuit, but it will be appreciated that this output has a magnitude somewhat less than $V_1 \cos \phi$ since the resistors 61 and 54 are connected in series with the filter circuit between the connection between the resistors 62 and 63 and those electrodes of double diode 60 which are connected directly together.

*Operation of Tunable Oscillator of FIGS. 1 and 2*

In order that the present invention may be more readily understood, some specific examples of the operation of the tunable oscillator will be considered. Firstly, we will consider the case when the dials of oscillator circuit 10 and discriminator apparatus 17 are set to read an exact multiple of 100 kc./s. and the frequency of oscillator circuit 10 is correct. In this case, the signal applied to delay network 18 will have a frequency of 1.6 mc./s.; thus, this signal is delayed by an integral number of complete cycles so that the signal appearing at the output of the delay network 18 is in phase with the signal applied to the control grid of pentode 70 and consequently with the signal appearing across winding 67. In this case, the dial of discriminator apparatus 17 is set to zero so that the output signal from rotor plate assembly 47 is 90° in advance of the output signal from delay network 18. Thus, the two signals applied to phase detector 20 will be in phase quadrature so that no output is obtained from phase detector 20.

Next, we will consider the case when the dials of oscillator circuit 10 and discriminator apparatus 17 are set to read an odd multiple of 50 kc./s. and the frequency of oscillator circuit 10 is again correct. Now two signals, of frequencies 1.55 and 1.65 mc./s., will be applied to discriminator apparatus 17 and delay network 18 will delay each of the signals passed by it by 180° in excess of an integral number of complete cycles. Thus, these signals are delayed by 180° with respect to the corresponding signals appearing across winding 67. In this case the dial of discriminator apparatus 17 is set to read 50 kc./s. so that each output signal from rotor plate assembly 47 is 270° in advance of each of the output signals from delay network 18. Thus, the signals applied to those electrodes of double diode 60 which are connected directly together are both 90° in advance of the signals appearing across the winding 67 so that again no output is obtained from the phase detector 20.

Finally, we will consider the case when the dials of oscillator 10 and discriminator apparatus 17 are set to read an exact multiple of 100 kc./s. but the output of oscillator circuit 10 is actually 10 kc./s. higher in frequency. In this case the signal applied to delay network 18 will have a frequency of 1.61 mc./s., so that the signal at the output of delay network 18 is effectively delayed by 36° with respect to the signal appearing across winding 67. The dial of discriminator apparatus 17 is set to zero so that the output of rotor plate asembly 47 is 54° (90°−36°) in advance of the signal appearing across winding 67. Thus, in this case, the two signals applied to phase detector 20 will be 54° out of phase with each other so that an output voltage will be obtained from phase detector 20 having a magnitude given by $V_1 \cos 54°$. This output voltage is fed through amplifier 21 to control circuit 22 and the sign of the voltage is such that circuit 22 will cause the frequency of the signal produced by oscillator circuit 10 to be changed in such a manner that the error between this frequency and the frequency indicated by the dials is reduced.

Suitable values of some of the components used in discriminator apparatus 17 when pentodes 30, 36, 50, and 70 are all Z 77 type and double diode 60 is D 77 type, both types being supplied by The General Electric Company Limited of England, are as follows:

| | | |
|---|---|---|
| Resistor **23** | ohms | 135 |
| Resistors **31**, **37** and **52** | do | 220 |
| Resistors **33** and **39** | do | 1,000 |
| Resistor **48** | do | 100,000 |
| Resistor **51** | do | 1,000 |
| Capacitor **53** | micromicrofarads | 680 |
| Resistors **62** and **63** | ohms | 470,000 |
| Capacitors **64** and **65** | micromicrofarads | 680 |
| Resistor **61** | ohms | 100,000 |
| Resistor **69** | do | 1,000 |
| Resistor **71** | do | 330 |
| Capacitor **72** | microfarad | 0.05 |
| Resistor **54** | ohms | 100,000 |
| Resistor **56** | do | 10,000 |
| Capacitor **55** | microfarads | 0.01 |
| Capacitor **57** | do | 2 |
| Resistor **58** | megohm | 1 |

A tunable discriminator circuit in accordance with the present invention has use in certain applications in which it is desired to obtain an output voltage which is dependent upon the frequency of a selected signal or a selected pair of adjacent signals derived from a plurality of signals respectively having different frequencies spaced apart by equal amounts and in which it is desired that that output voltage which is dependent on said adjacent pair of signals should be the same as if it were dependent upon only one of that pair of signals; in such a case the discriminator circuit will be arranged so that that value of said first amount of difference in phase which corresponds to the application of one of said pair of adjacent signals to the circuit differs by substantially 360° from that value of said first amount of difference in phase which corresponds to the application of the other of said pair of adjacent signals to the circuit.

It will be appreciated that the tunable oscillator described above could be used as the local oscillator of a superheterodyne radio receiver designed to be continuously tunable over a wide range, or it could be used to control the carrier frequency of a radio transmitter.

It will also be appreciated that, while in the above description the discriminator apparatus has been used in connection with an automatic frequency control arrangement, the discriminator could also be used as a frequency modulation detector or as a phase modulation detector.

In an alternative arrangement to that described above, delay network 18 could be replaced by a number of band pass filter sections; for example, an appropriate four-section band pass filter could possibly be used which is so designed that each section of it causes a difference of approximately 90° in the phase shift of two signals having frequencies spaced 100 kc./s. apart which are passed through it.

While there has been described what is at present considered to be the preferred embodiment of this invention, it will be obvious to those skilled in the art that various changes and modifications may be made therein without departing from the invention, and it is, therefore, aimed to cover all such changes and modifications as fall within the true spirit and scope of the invention.

What is claimed is:

1. Continuously tunable discriminator apparatus comprising: means for supplying a wave signal normally having a frequency component which may be varied within a fixed range but subject to having a plurality of frequency components within said range respectively spaced apart by a predetermined difference frequency; means including a plurality of signal-translating channels coupled to said supply means for deriving from said supplied wave signal a corresponding plurality of signals having the same frequency, one of said channels including means for varying the phase of one of said derived signals by a first amount dependent upon said wave signal frequency up to a maximum limit equivalent to the period of one cycle of said difference frequency, said one channel also including continuously rotatable means for varying the phase of said one signal by a second amount which is substantially independent of said supply signal frequency; and means responsive to said plurality of signals for deriving an output voltage having a magnitude dependent upon the over-all phase difference between said plurality of signals.

2. Continuously tunable discriminator apparatus comprising: means for supplying a wave signal having a set of frequency components spaced apart by a fixed difference frequency and which may be varied within a fixed range; means including a plurality of signal-translating channels coupled to said supply means for deriving from said supplied wave signal a pair of signals having the same frequency, one of said channels including means for varying the phase of one of said derived signals substantially independent of said supply signal frequency; and means responsive to said derived pair of signals for developing an output voltage having a magnitude dependent upon the over-all phase difference between said derived pair of signals.

3. Continuously tunable discriminator apparatus comprising: means for supplying a wave signal having a frequency component which may be varied within a fixed range but subject to having a pair of frequency components within said range respectively spaced apart by a predetermined difference frequency; means coupled to said supply means and including signal-translating channels in parallel for deriving from said supplied wave signal a pair of signals having the same frequency, one of said channels including, in cascade, means for altering the phase of one of said pair of signals by a first amount dependent upon said supply signal frequency up to a maximum limit equivalent to the period of one cycle of said difference frequency and continuously rotatable means for varying the phase of said one signal by a second amount which is substantially independent of said supply signal frequency; and means responsive to said pair of signals for deriving an output voltage having a magnitude dependent upon the over-all phase difference between said pair of signals.

4. Continuously tunable discriminator apparatus comprising: means for supplying a wave signal having a frequency component which may be varied within a fixed range but subject to having a pair of frequency components within said range respectively spaced apart by a predetermined difference frequency; means coupled to said supply means and including two signal-translating channels coupled in parallel for deriving from said supplied wave signal a pair of signals having the same frequency, one of said channels including, in cascade, delay network means for altering the phase of one of said pair of signals by a predetermined amount dependent upon said supply signal frequency up to a maximum limit equal to the period of one cycle of said difference frequency and means including a quadrature phase splitting network and a continuously tunable capacitance coupled to the output of said quadrature network for further altering said one signal by a second amount which is variable but substantially independent of said supply signal frequency; and means responsive to said pair of signals for deriving an output voltage having a magnitude dependent upon the over-all phase difference between said pair of signals.

5. Continuously tunable discriminator apparatus comprising: means for supplying a wave signal having a frequency component which may be varied within a fixed range but subject to having a pair of frequency components within said range respectively spaced apart by a predetermined difference frequency; means coupled to said supply means and including two signal-translating channels coupled in parallel for deriving from said supplied wave signal a pair of signals having the same frequency, one of said channels including, in cascade, delay network means for altering the phase of one of said pair of signals by a predetermined amount dependent upon said supply signal frequency up to a maximum limit equal to the period of one cycle of said difference frequency and means for altering said one signal by a second amount which is variable but substantially independent of said supply signal frequency, said second means including a constant resistance quadrature phase splitting network for developing quadrature components from said one signal and continuously tunable capacitive means responsive to said quadrature components for recreating said one signal with a tunably variable phase relative to its original phase; and means responsive to said pair of signals for deriving an output voltage having a magnitude dependent upon the over-all phase difference between said pair of signals.

6. Continuously tunable discriminator apparatus comprising: means for supplying a wave signal normally having a frequency component which may be varied within a fixed range but subject to having a pair of frequency components within said range respectively spaced apart by a predetermined difference frequency; means including a plurality of signal-translating channels coupled in parallel to said supply circuit means for deriving from said supplied wave signal a corresponding pair of signals having the same frequency, one of said channels including means for varying the phase of one of said derived signals by a first amount dependent upon said supply signal frequency up to a maximum limit equivalent to the period of one cycle of said difference frequency, said one channel also including continuously rotatable means for varying the phase of said one signal by a second amount which is substantially independent of said supply signal frequency; and quadrature phase detector means coupled to said channels and responsive to said pair of signals for deriving an output voltage having a magnitude dependent upon the over-all phase difference between said pair of signals.

7. Continuously tunable discriminator apparatus comprising: means for supplying a wave signal having a frequency component which may be varied within a fixed range but subject to having a pair of frequency components within said range respectively spaced apart by a predetermined difference frequency; means coupled to said supply means and including two signal-translating channels coupled in parallel for deriving from said supplied wave signal a pair of signals having the same frequency, one of said channels including, in cascade, delay network means for altering the phase of one of said pair of signals by a predetermined amount dependent upon said supply signal frequency up to a maximum limit equal to the period of one cycle of said difference frequency and means for altering said one signal by a second amount which is variable but substantially independent of said supply signal frequency, said second means including a constant resistance quadrature phase splitting network for developing quadrature components from said one signal and continuously tunable capacitive means responsive to said quadrature components for recreating said one signal with a tunably variable phase relative to its original phase, the other of said channels including means for translating the other of said pair of signals with effectively no alteration in phase; and quadrature phase detector means coupled to said channels and responsive to said pair of signals for deriving an output voltage having a magnitude dependent upon the overall phase difference between said pair of signals.

References Cited in the file of this patent

UNITED STATES PATENTS

| | | |
|---|---|---|
| 2,519,836 | Hurault | Aug. 22, 1950 |
| 2,786,140 | Lewis | Mar. 19, 1957 |
| 2,835,802 | Day | May 20, 1958 |
| 2,838,673 | Fernsler et al. | June 10, 1958 |

FOREIGN PATENTS

| | | |
|---|---|---|
| 129,840 | Australia | Nov. 5, 1948 |